US 6,638,847 B1

(12) United States Patent
Cheung et al.

(10) Patent No.: US 6,638,847 B1
(45) Date of Patent: Oct. 28, 2003

(54) METHOD OF FORMING LEAD-FREE BUMP INTERCONNECTIONS

(75) Inventors: Edwin Wai Ming Cheung, Kowloon (HK); Zaheed Sadrudin Karim, New Territories (HK)

(73) Assignee: Advanced Interconnect Technology Ltd., Kowloon (HK)

(*) Notice: Subject to any disclaimer, the term of this patent is extended or adjusted under 35 U.S.C. 154(b) by 0 days.

(21) Appl. No.: 09/552,560

(22) Filed: Apr. 19, 2000

(51) Int. Cl.$^7$ .......................... H01L 21/44; H01L 23/48
(52) U.S. Cl. .................... 438/612; 438/108; 438/613; 438/614; 438/597; 438/687; 257/738; 257/751; 257/753; 257/766; 257/787; 257/789
(58) Field of Search ................. 438/612, 614, 438/615, 687, 14, 597, 660, 108, 613, 616; 257/738, 751, 753, 766, 772, 778, 779, 780

(56) References Cited

U.S. PATENT DOCUMENTS

| 4,159,231 A | * | 6/1979 | Smith et al. ................. 204/57 |
| 4,721,551 A | * | 1/1988 | Byers et al. ................. 204/47 |
| 5,039,576 A | | 8/1991 | Wilson ....................... 428/626 |
| 5,229,016 A | * | 7/1993 | Hayes et al. ................. 222/590 |
| 5,316,205 A | | 5/1994 | Melton ................... 228/180.21 |
| 5,410,184 A | * | 4/1995 | Melton et al. ............... 257/772 |
| 5,818,699 A | | 10/1998 | Fukuoka ..................... 361/760 |
| 5,851,482 A | | 12/1998 | Kim ........................... 420/557 |
| 5,873,161 A | * | 2/1999 | Chen et al. .................... 29/830 |
| 5,902,472 A | * | 5/1999 | Arai et al. .................... 205/125 |
| 5,937,320 A | | 8/1999 | Andricacos et al. .......... 438/614 |
| 5,949,654 A | | 9/1999 | Fukuoka ..................... 361/760 |
| 6,013,572 A | | 1/2000 | Hur et al. .................... 438/614 |
| 6,123,248 A | | 9/2000 | Tadauchi et al. .......... 228/111.5 |
| 6,179,935 B1 | | 1/2001 | Yamashita et al. .......... 148/400 |
| 6,224,690 B1 | * | 5/2001 | Andricacos et al. ......... 148/400 |

FOREIGN PATENT DOCUMENTS

| DE | 19816671 A1 | 10/1998 | ........... B23K/35/24 |
| DE | 19827014 A1 | 12/1998 | ............. B23K/1/00 |
| EP | 0382080 A2 | 8/1990 | ......... H01L/23/485 |
| EP | 0818563 A1 | 1/1998 | ............. C25D/3/56 |
| EP | 0825281 A1 | 2/1998 | ............. C25D/5/18 |
| EP | 0877419 A2 | 11/1998 | ........... H01L/21/60 |
| JP | 2000054189 | 2/2000 | ............. C25D/7/00 |
| JP | 2000068410 | 3/2000 | ........... H01L/23/12 |
| WO | WO 98/53493 | 11/1998 | ........... H01L/21/44 |

OTHER PUBLICATIONS

EPO Search Report in connection with corresponding EPO Application No. 01302292.6 dated Dec. 6, 2001.
Dave Butters, Great Britain Application No. 0030870.0 Search Report under Section 17, Mar. 27, 2001.

* cited by examiner

Primary Examiner—Matthew Smith
Assistant Examiner—Igwe U. Anya
(74) Attorney, Agent, or Firm—Dorsey & Whitney LLP (57) ABSTRACT

A method of forming solder bumps on a chip or wafer for flip-chip applications comprises the steps of providing a chip or wafer having a plurality of metal bonds pads which provide electrical connection to the chip or wafer, and applying a solder bump comprising pure tin or a tin alloy selected from tin-copper, tin-silver, tin-bismuth or tin-silver-copper by an electroplating technique, and melting the solder bumps by heating to a temperature above the bump melting point to effect reflow.

11 Claims, 6 Drawing Sheets as-plated after reflow

FIG. 3 as-plated

FIG. 4(a)

after reflow

FIG. 4(b)

as-plated

FIG. 5(a)

after reflow

FIG. 5(b)

as-plated

FIG. 6(a)

after reflow

FIG. 6(b)

METHOD OF FORMING LEAD-FREE BUMP INTERCONNECTIONS

BACKGROUND OF THE INVENTION

The present invention relates to a method of forming lead-free solder bump interconnections on semiconductor wafers for flip-chip bonding applications.

With flip-chip interconnect technology, a raised electrically conductive contact called a "bump" is first formed onto the input/output connection pads of an integrated circuit (IC) which is subsequently assembled face-down (or "flip-chip" bonded) without the use of conventional wire bonds or leads. Various bump interconnection media have been proposed including gold, lead-tin solder, nickel, copper, and conductive polymers. Lead-tin bumps are particularly attractive due to the self-alignment and self-planarizing properties (upon reflow) of solder which allows for a more robust and manufacturable attachment process. In addition to providing electrical contact, the solder bump also forms a mechanical, and thermal connection between the chip and substrate. The use of lead-tin solder bumps for flip-chip applications was first introduced by IBM in the 1960's in their C4 (controlled-collapse-chip-connection) technology using a method of evaporation for fabrication of the bumps.

Primary advantages of flip-chip technology as compared to other interconnection techniques include:

i) the capacity to significantly increase the total number of connections that can be made to the chip because the small bump contacts can be placed virtually anywhere on the surface of the chip and at points convenient for a particular application (unlike "perimeter-only" bonding technologies such as wire-bonding and tape-automated-bonding (TAB));

ii) the potential to shrink the die size and obviate the need for long metallization lines leading to the periphery pads which would favourably impact both the IC manufacturing yield and reliability;

iii) lower electrical resistance and inductance values leading to faster interconnection speeds and lower power consumption;

iv) better thermal dissipation performance due to conduction through the solder bumps and exposed rear surface of the IC after flip-chip bonding;

v) provision for a smaller, lighter, and more compact package with overall lower packaging cost per pin.

The selection of the precise composition of a solder bump material is conventionally influenced by a variety of factors, most particularly melting point. Attention must be paid to the solder melting point, particularly where the chip is bonded to a substrate which are mostly formed of low-cost organic materials with relatively low Tg (glass transition temperatures). When the IC is flip-chip bonded, it is normally heated to a temperature which is typically 20–30° C. higher than the melting point of the solder. Too high a melting point for the solder bump may therefore lead to damage of the substrate.

The two most common bump materials currently in use for flip-chip bonding applications consist of pure gold and lead-tin based alloys. The former are used mainly to flip-chip a silicon IC onto liquid crystal displays (LCDs) or in TAB packages. Lead-tin solder bumps are used primarily for flip-chip-on-board or flip-chip-in-package applications. Solder bumps are typically preferred over gold bumps due to their lower cost and self-planarizing and self-aligning reflow characteristics which provides for a more manufacturable and robust flip-chip bonding process.

Lead-tin alloys commonly employed as solder bumps include in particular 95 wt %Pb/5 wt %Sn, 97 wt %Pb/3 wt %Sn, and eutectic 37 wt %Pb/63 wt %Sn. Lead-based solders with additions of In, Ag, and Bi have also been proposed.

With growing environmental awareness, a worldwide ban on the use of lead-containing solders in electronic products is under consideration since the lead from such products, which are typically disposed of in landfills, eventually leaches into the drinking water system. Laws restricting the use of lead in electronics products may be enacted in the European Community, and similar legislation to ban lead is pending in the United States and in Japan. Efforts to identify suitable lead-free finishes for electronic components has thus far been focused mainly on printed circuit boards, lead frame packages, and in the selection of solder pastes. Little attention has been paid to the fabrication of bump interconnections for flip-chip applications.

Lead-free solders have been proposed including those based on indium and its alloys with bismuth, tin, antimony, zinc and silver.

What is required are lead-free solder bump compositions which can be directly substituted for the lead-tin alloys conventionally used for flip-chip applications, and a fabrication method employing such a lead-free solder bump composition.

It is proposed in U.S. Pat. No. 5,410,184 assigned to Motorola to utilise a lead-free solder alloy having tin as a predominant component, between 2–8%wt or more preferably 3—5%wt copper and up to 1.5%wt silver. This solder requires the presence of an amount of copper at preferably 3–5%wt so as to retain formation of a certain degree of intermetallics for bond integrity. It is found however that this composition may suffer problems of bond embrittlement owing to an excessive formation of the tin-copper intermetallics.

The present invention seeks to provide a process for forming solder bumps which overcomes the problems mentioned above.

SUMMARY OF THE INVENTION

According to a first aspect the invention resides in a method of forming solder bumps on a chip or wafer for flip-chip applications, comprising the steps of providing a chip or wafer having a plurality of metal bonds pads which provide electrical connection to the chip or wafer, and applying a solder bump comprising pure tin or a tin alloy selected from tin-copper, tin-silver, tin-bismuth or tin-silver-copper by an electroplating technique, and melting the solder bumps by heating to a temperature above the bump melting point to effect reflow.

The solder is more preferably one of pure tin, tin-copper alloy of less than 2% weight copper or more preferably about 0.7% by weight copper, tin-silver alloy having less than 20% by weight silver or more preferably about 3.5% by weight silver, or 10% by weight silver, tin-bismuth having between 5% and 25% by weight bismuth or more preferably about 20% by weight bismuth, or tin-silver-copper alloy having less than 5 wt % silver, and preferably about 3.5 wt %Ag, less than 2 wt % copper and preferably about 0.7 wt %Cu, with the balance being tin.

It is found that pure tin or the tin alloys can be directly substituted for the conventional lead-tin alloys, whilst the solder bumps can be formed using electroplating to give particularly well-defined, regular bumps. The tin-based solders identified are also compatible with existing reflow processes and materials, and with surface mount techniques and equipment.

In the case of the binary alloys tin-copper, tin-silver and tin-bismuth the elements can be simultaneously co-deposited as the alloy from a single plating solution.

In an alternative technique the elements can be sequentially deposited from separate plating solutions, which form the requisite alloys on heating during the reflow process. This sequential plating is particularly applicable also to the ternary alloy tin-silver-copper. In this case the alloy is deposited by depositing one or other of tin-copper alloy from a single plating solution by co-deposition, or elemental silver, followed by deposition of the other, the ternary alloy forming on heating. It is also possible to sequentially deposit each of the three elements.

The chip or wafer may be, before electroplating, provided with a sputtered layer or layers of metal which function as a diffusion barrier, barrier to oxidation, adhesion, and plating contact layer (electrical buss). A layer of thick photosensitive polymer material such as photoresist (negative or positive tone) or dry film with a thickness of between 25–200 μm is used to define the location and volume of the solder bumps to be plated. The provision of thick photoresist or dry-film is important to ensure sufficient height and volume of the plated solder bump without causing shorting to the next adjacent bump, and to maintain the necessary stand-off height between the chip and the substrate in order to compensate for differences in thermal coefficients of expansion of the chip and the substrate as well to provide a sufficient gap for underfill material to flow between the chip and the substrate after flip-chip bonding.

The electroplating of the solder bumps can be carried out using either direct current (DC) or pulsed alternating current. The current and voltage values depend on the size of the wafer and the total exposed surface area to be plated. Preferable DC plating parameters range between 3–5 V with a current of between 0.05–0.1 A. In a preferable pulsed plating cycle voltage alternates between +5 V for about 1 millisecond, a zero voltage portion for about 1 millisecond or less, between −5 to −10 V for 1 millisecond, followed by zero voltage for about 1 millisecond.

Either rack or fountain plating equipment may be used for plating of the solder on the wafers.

According to a further aspect the invention resides in a method for forming solder bumps on a chip or wafer for flip-chip applications comprising the steps of: (a) providing a chip or wafer having a passivation layer and a plurality of exposed metallic bond pads; (b) applying at least one solder-wettable metal layer to the bond pad; (c) applying a photosensitive layer to the chip or wafer having openings at the portions of the bond pads; (d) applying a solder comprising pure tin, or a tin alloy selected from tin-copper, tin-silver, tin-bismuth, or tin-silver-copper by an electroplating technique; (e) removing the photoresist layer; and (f) melting the solder bumps to effect reflow.

The invention also resides in a chip or wafer when formed according to the methods described above.

BRIEF DESCRIPTION OF THE DRAWINGS

Embodiments of the invention are now described, by way of example only, with reference to the following drawings in which.

DESCRIPTION OF THE PREFERRED EMBODIMENTS

Figure 1:
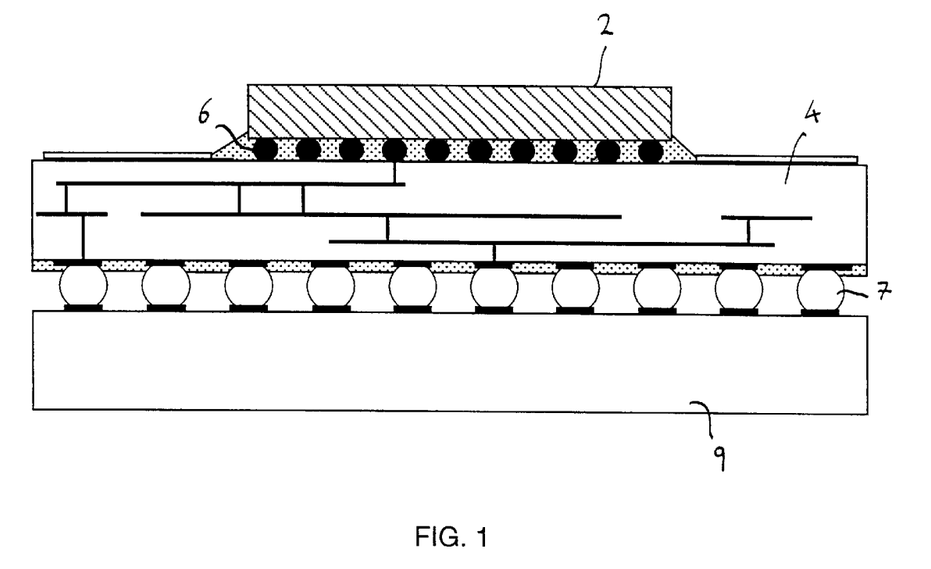
FIG. 1 is a sectional view of a flip-chip in a package.

Turning to the drawings, FIG. 1 shows an integrated circuit 2 which is "flip-chip" bonded to a substrate 4 by means of metallized contacts 6 of solder referred to in the art as "bumps". The substrate 4 can be a printed circuit board or an intermediate package such as a Ball Grid Array (BGA) or Chip-Scale-Package (CSP) itself bonded to a printed circuit board 9 through additional solder balls 7 or leads. The package can be formed of organic, ceramic, or metal materials.

The present invention utilizes metal solders which are substantially lead-free (aside from lead present at an impurity level, typically 10 p.p.m being tolerated). It is found that particularly advantageous compositions include pure tin, or tin which includes a small amount of an alloying element such as copper, silver, or bismuth, or both silver and copper. It is found that the incorporation of such an alloying element is effective in lowering the melting point of pure tin, in preventing the formation of whiskers on as-plated deposits, in lowering the surface tension of tin (550 dyne/cm at 232° C.), to improve the mechanical properties of tin (such as ductility), and in preventing a phase change of pure tin from β to α form which occurs below 13° C. This phase change is accompanied by a volume change which leads to a decrease in mechanical strength, as well as compromising bond integrity and strength. The solder bump materials are discussed in further detail below.

FIGS. 2(a) to (d) and 3(a)/(a1) to (d) illustrate a fabrication process for forming metal solder bump interconnections of the described compositions utilizing an electroplating technique.

Figure 2:
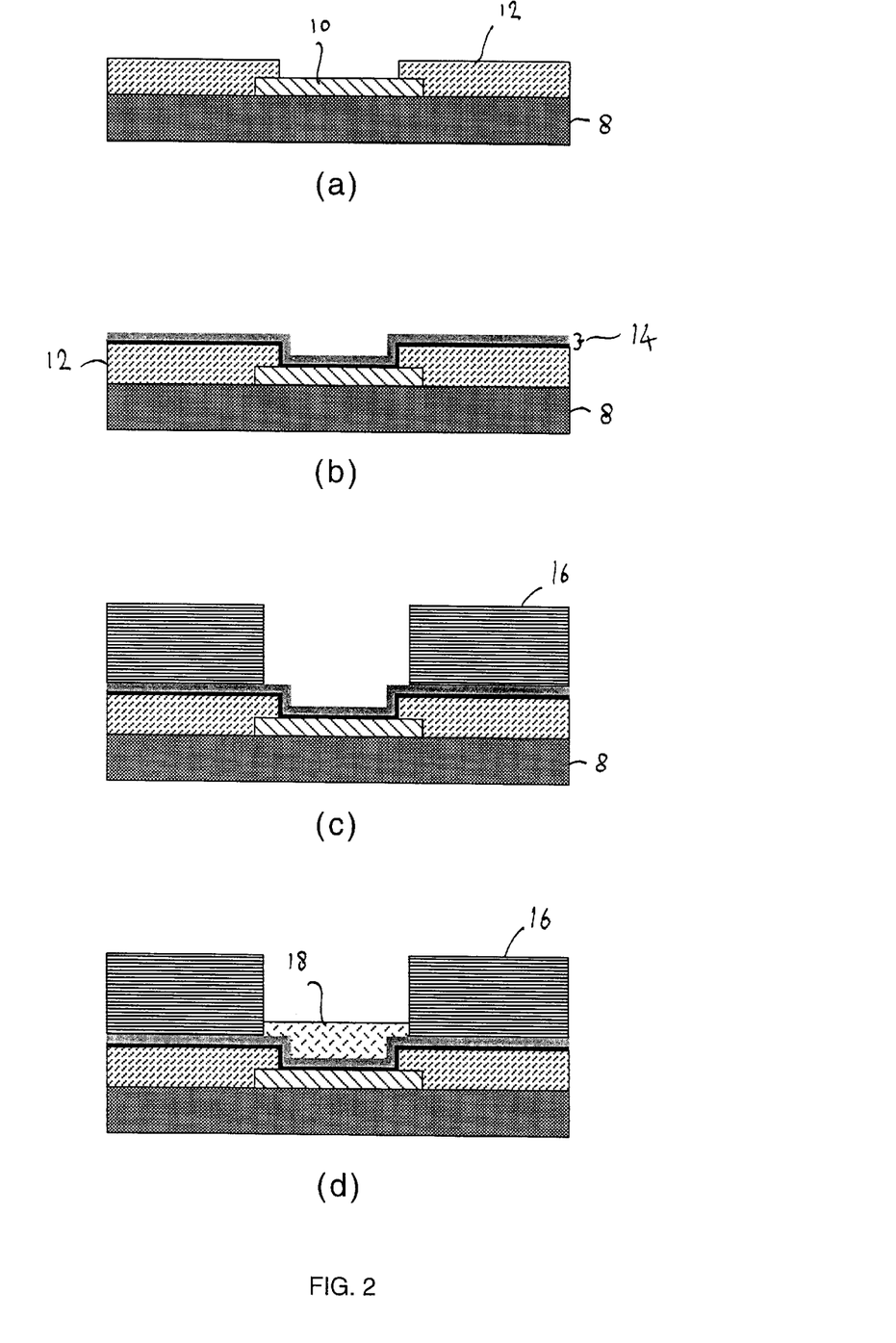
FIGS. 2(a) to (d) illustrate the first four stages of deposition of solder bumps.

FIG. 2(a) shows the semiconductor wafer 8 to which has previously been applied at appropriate locations bond pads, which are conventionally made of Al:Si (1–2 wt %Si) or Al:Si:Cu (1–2 wt %Si and 1–5 wt %Cu), or more recently pure copper, and a glass passivation layer 12 which extends over the wafer, but is removed at appropriate positions to expose the bond pads 10. The bond pads make electrical connection to the active areas of the chips.

The first step involves cleaning of the wafer 8 by a back-sputter process performed under vacuum in order to remove the naturally formed oxide layer on the bond pads. The cleaning step is followed by the sputter deposition of a single or series of metal layers 14 and usually two as indicated in FIG. 2(b). The first metal layer which is typically made of chrome, with a thickness of between 500–1000 Å performs a number of functions including increasing adhesion to the cleaned bond pads, and to the glass passivation, preventing re-oxidation of the metal pad and forming a barrier diffusion layer to the solder. Ti/W, NiV or Ti may also be used for the first layer. The second metal layer is formed of copper of thickness 2500–10000 Å to form a seed layer for the under bump metal and to also provide a contact plating (electrical buss) layer. Nikel may be used in lieu of copper for the second layer.

The next step consists of patterning the wafer with a thick (preferably between 50–200 μm) layer of an ultra-violet sensitive photoimagable organic film 16 such as a liquid photoresist or dry film as indicated in FIG. 2(c) which is deposited by spinning it onto the surface of the wafer following by baking to harden the layer, or by lamination of the dry film. To produce such a thickness with liquid resists, a two-step application and baking may be required. The photosensitive layer is then patterned by exposing it through a metal-coated glass photomask which has openings selectively etched in the metal layer to define the areas to be bumped. These openings allow ultra-violet light to pass through and expose the photosensitive layer. The thickness of the photosensitive layer and the size of the opening determines in part the final volume and shape of the solder bump. The thickness is important to ensure sufficient bump height is obtained to ensure sufficient chip stand-off from the substrate after the bump is reflowed and flip-chip bonded. Either positive or negative tone photosensitive polymers may be used for this process. After developing the photosensitive layer, which provides a protective layer to areas that are not to be plated, electrical contacts points are opened at the edges of the wafer to the underlying sputtered copper layer and the wafer is then plated with either copper (or nickel) to form the under-bump-metal (UBM) 18 as indicated in FIG. 2(d). This layer which is normally between 3–7 $\mu$m thick acts as a "wettable" foundation to the solder bump.

The wafer is then electroplated with solder (FIG. 3(a)) and by selecting the appropriate type of plating solution and anodes in the plating bath, lead-free deposits of pure tin, or alloys comprising tin-copper, tin-silver, or tin-bismuth bumps 20 can be formed from a single plating solution with simultaneous co-deposition of the respective elements in the desired stoichiometry. Plating solutions from a variety of providers can be employed, for example those of Shipley Ronal. For pure tin electroplating Shipley Ronal's "Tinglo Culmo" product is particularly appropriate, whilst for tin-bismuth their "Solderon BI" product is appropriate. A negative voltage is usually applied to the wafer effectively making it the cathode. For each of these desired alloys either a pure tin anode or tin-copper anode is utilized in the case of a soluble anode technique, or for tin-bismuth deposition an insoluble platinized titanium anode is preferred. The tin-copper, tin-bismuth, and tin-silver plated deposits can be formed either from a single plating solution with simultaneous co-deposition of the respective elements in the desired stoichiometric amounts or by sequential plating of the pure elements (in the desired amounts) followed by reflow of the plated deposit to achieve an alloy with the desired composition. An applied current density of 3–5 A.S.D (amps per square decimetre) is found to be appropriate. Either direct current (DC) or pulse-plating techniques can be used in conjunction with rack or fountain (cup) plating equipment. For D.C. plating 3–5 V with a current of between 0.05 to 0.1 A is preferred. For a pulsed alternating current, a pulse comprising about +5 V for about 1 millisecond, followed by zero V for about 1 millisecond, followed by −5 V for 1 millisecond, followed by zero V for 1 millisecond is found to be beneficial in terms of bump uniformity and composition of the deposit.

It has also been found that instead of simultaneously depositing the respective elements from a single plating solution, the pure elements may be deposited by sequentially plating from separate plating solutions, and controlling the plating time to control the relative amounts of each element. Whilst this results in a layered structure of the pure elements, when the plated deposit is reflowed (as discussed further below) the resultant bump is an alloy of the desired stoichiometry. This sequential plating can be employed for any of the binary alloys discussed. It is found to be generally unimportant which element is plated first and which second.

In the case of tin-silver-copper this sequential technique is found to be particularly useful, as plating of ternary alloys from a single plating solution is difficult owing to the difficulty in accurately controlling the resultant alloy composition. In this case a tin-copper deposit is preferably formed separately from the silver by first simultaneously co-depositing tin-copper from a single binary plating solution, followed by plating of pure silver. On reflow of the as-plated deposits the desired ternary alloy is formed. Alternatively, the silver may be deposited first, followed by plating of tin-copper. As a further alternative, the three individual elements may be sequentially deposited. This option is viable for deposition of relatively large bumps, but becomes more difficult with smaller bumps owing to the fact that the proportion of copper is small (less than 2%, and preferably about 0.7%), and accurate control of the amount of deposited copper becomes then more difficult.

Figure 3:
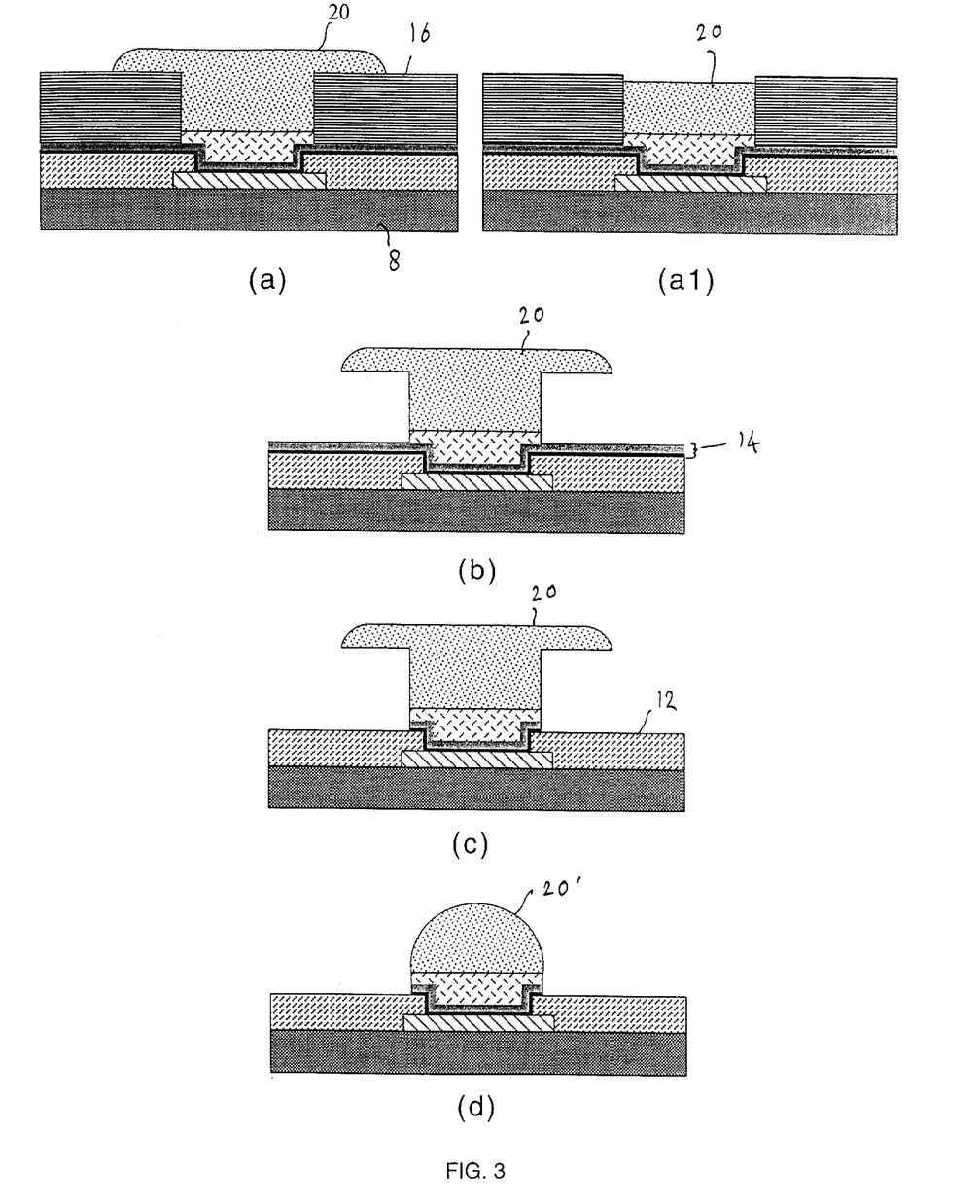
FIGS. 3(a) to (d) illustrate the deposition steps subsequent to those of FIGS. 2(a) to (d)

If the plating process is stopped before the solder reaches the top of the patterned photosensitive layer, the bump will form a pillar shape (FIG. 3(a1). If the plating process is continued above the height of the photoresist, a "mushroom" shape will form (FIG. 3(a)). Mushrooming can be used if necessary to increase the volume of the solder in instances where it is not possible to pattern the photosensitive layer to the desired height.

Further steps in completing the bump fabrication process involve removal of the protective photosensitive layer as shown in FIG. 3(b) and back-etching of the sputtered copper and chrome layers using chemical means as indicated in FIG. 3(c).

Flux is then applied to the as-plated bumps and they are re-flowed in an oven to form the spherical solder shape 20'. Alternatively a flux-less reflow of the bump can be achieved when using a combination of a reducing nitrogen and hydrogen environment.

The particular selected bump solder materials are as follows:

a) Pure Tin

This is selected because it is the simplest, cheapest, and easiest to fabricate as a lead-free replacement for lead-tin bumps, and yet has fairly similar physical, electrical and thermal characteristics to lead-tin solder. It also has a low toxicity and good solderability.

Despite the fact that there is a strong prejudice against using pure tin in microelectronic packages due to the well-documented effect of formation over time of tin whiskers (which can cause shorting and device failure), the use as solder bump for a flip-chip application does not suffer the problem of whisker formation. It is believed that whisker formation is a stress-time dependent effect, and it is believed the reflow process relieves this stress.

b) Tin-Copper

The percentage of copper must be less than 2 wt % and preferably in the region of about 0.7 wt % which represents the eutectic point, this composition exhibiting a melting point of 227° C. Concentrations of copper much greater than about 2% are undesirable as they have an increased melting point (which increases fabrication problems) and because copper forms intermetallic compounds with tin which are brittle and therefore mechanically unstable. The tin-copper alloy system with a composition of 99.3 wt %Sn/0.7 wt %Cu with a melting point of 227° C. can be considered as a lead-free replacement for high-lead (95 wt %Pb/5 wt %Sn or 97 wt %Pb/3 wt %Sn) alloys which have melting points in excess of 300° C. The tin-copper alloy systems could also be considered as a replacement for eutectic lead-tin bumps if the substrate is able to tolerate a reflow temperature of about 260° C.

c) Tin-Silver

The percentage of silver for most applications must be less than 5%wt and preferably 3.5%wt which is the eutectic point of the alloy system. Small additions of silver may be desired since they have shown to significantly increase the ductility of pure tin which may be desirable in cases where the bumps may be subjected to stress and multiple thermal cycling. Concentrations of silver higher than 3.5%wt are typically not desirable due to the high cost of silver. Moreover, the melting point of the Sn—Ag system increases rapidly with increasing silver content. For example, at the eutectic point of 3.5%wt silver the melting point is 221° C. At 10%wt silver the melting point is 300° C. which is too high for most low-cost organic substrate or packaging materials. However, in cases where a high melting point (in excess of 300° C.) lead-free solder bump is desired, such as for flip-chip bonding onto ceramic substrates, a silver composition of less than 20% and more preferably about 10% is preferred. At 20% silver the melting point is about 375° C. which is potentially useful for certain high temperature applications, although at 10% silver the melting point is about 300° C. which is comparable to the melting point of existing 95 wt %Pb/5 wt %Sn and 95 wt %Pb/3 wt %Sn alloys. Thus, the eutectic (96.5 wt %Sn/3.5 wt %Ag) and high-silver (90 wt %Sn/10 wt %Ag) content alloys can be considered as lead-free replacements of eutectic (37 wt %Pb/63 wt %Sn) and high-lead (95 wt %Pb/5 wt %Sn or 97 wt %Pb/3 wt %Sn) alloys respectively.

d) Tin-Bismuth

The percentage of bismuth is selected to be in the range of 10–25%wt. The tin-bismuth system exhibits an acceptable melting point over a wide range of compositions; 225° C. at 10% Bi and 138.5° C. at 60% (which represents the eutectic point). At about 20%wt bismuth, the melting point of the Sn—Bi alloy is 185° C. which is similar to that of eutectic lead-tin at 183° C. so this particular Sn—Bi alloy can therefore be used as a "drop-in" replacement to the eutectic lead-tin solder.

e) Tin-Silver-Copper

The tin-silver-copper alloy has a composition of less than 5 wt % silver, preferably in the region of 3.5 wt %Ag, less than 2 wt % copper, preferably in the region of 0.7 wt %Cu, with the balance being tin. This alloy has a melting point of between 216° C. and 217° C. which makes it suitable as a substitute for eutectic lead-tin solders.

The above-described elemental tin and tin alloy compositions applied by electroplating are found to produce solder bumps which are lead free whilst having properties compatible with those of conventional lead-tin solder bumps.

Figure 4A:
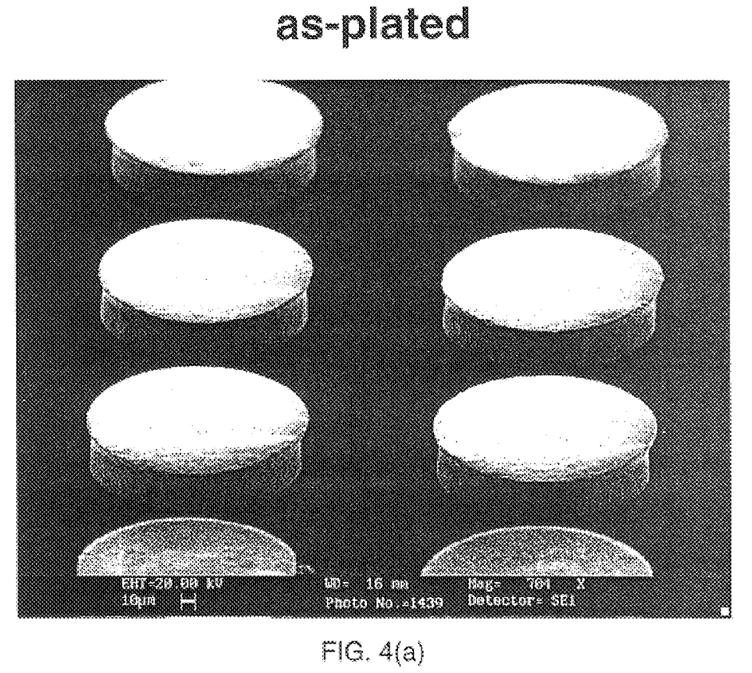
FIGS. 4(a) and (b) show scanning electron micrographs of tin-copper bumps formed according to the invention.
Figure 4B:
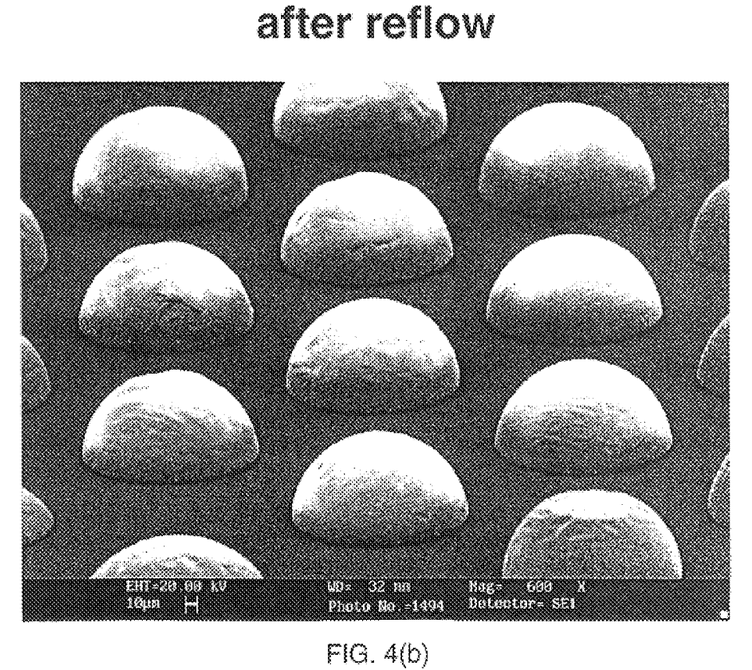

FIG. 4(a) is a scanning electron micrograph of eutectic tin-copper bumps as-plated, whilst FIG. 4(b) shows these after reflow, showing highly regular well-defined bumps.

Figure 5A:
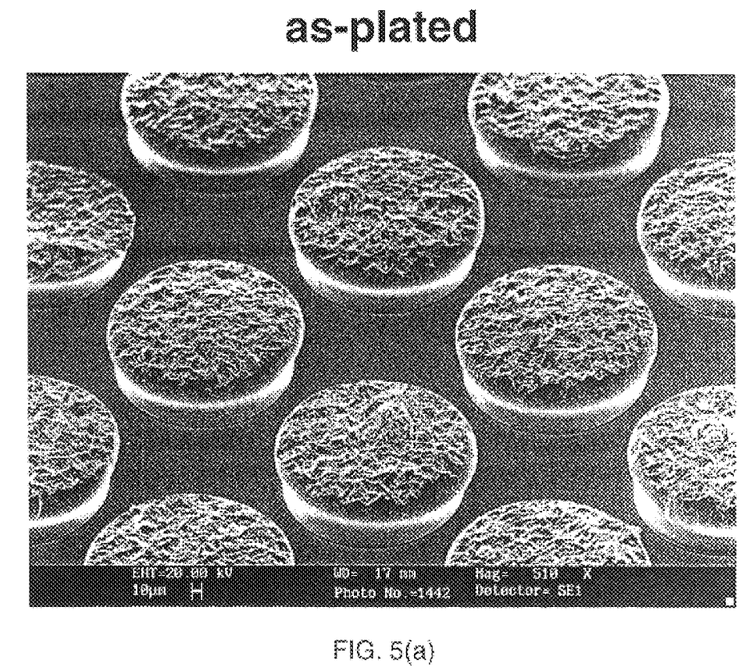
FIGS. 5(a) and (b) show scanning electron micrographs of tin-bismuth bumps formed according to the invention.
Figure 5B:
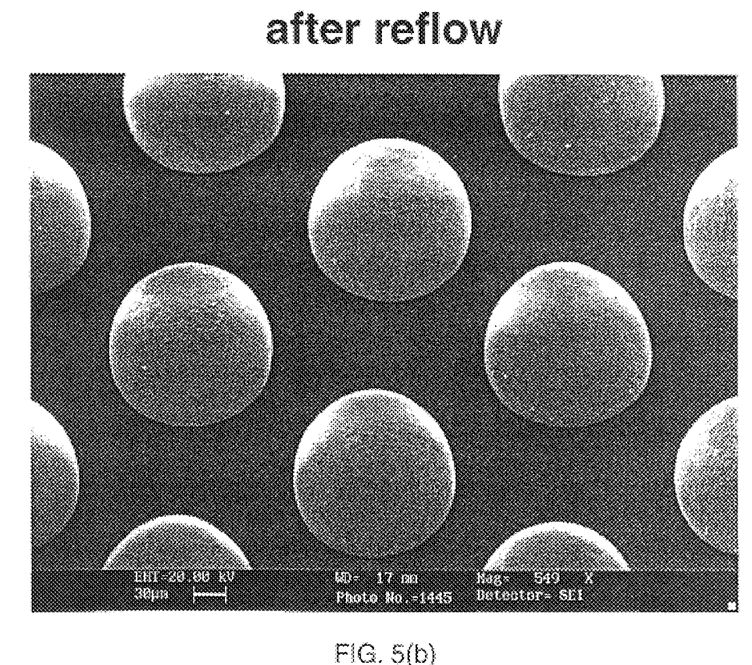

FIGS. 5(a) and (b) are scanning electron micrographs of tin-bismuth solder bumps for 90 wt %Sn:10 wt %Bi, also exhibiting regular well-defined solder bumps of appropriate height for bonding to a substrate.

Figure 6A:
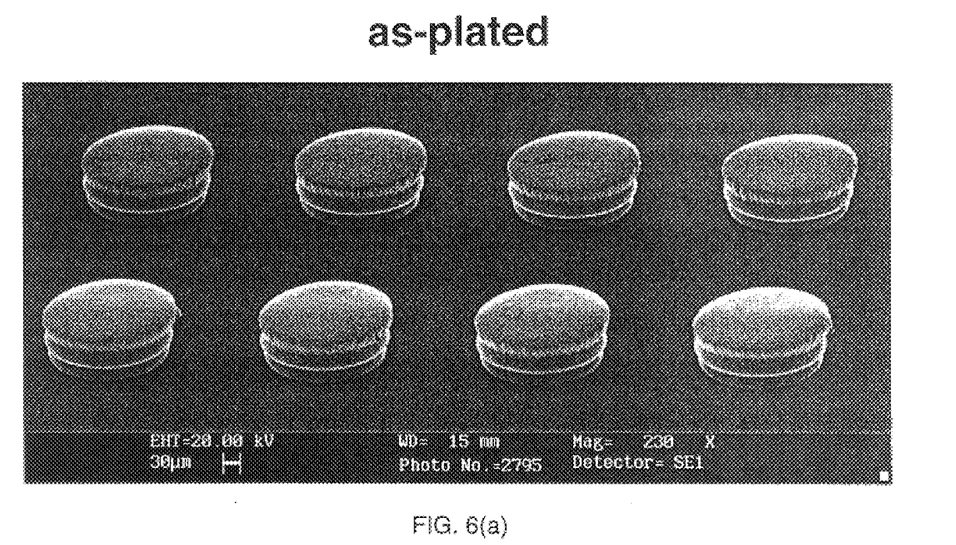
FIGS. 6(a) and (b) show scanning electron micrographs of pure tin bumps.
Figure 6B:
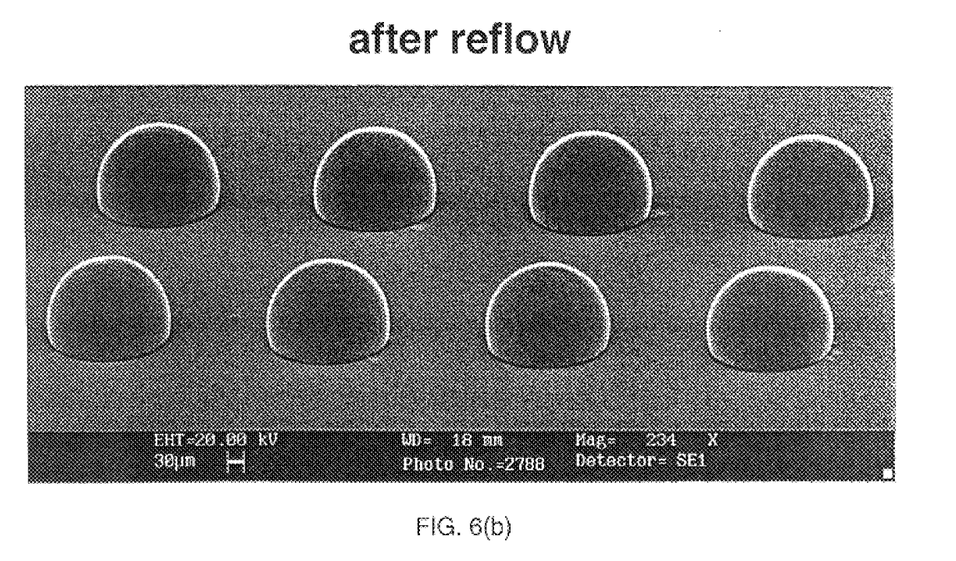

FIGS. 6(a) and (b) are scanning electron micrographs of as-plated and after reflow pure tin solder bumps.

What is claimed is:

1. A method of forming solder bumps on a chip or wafer for flip-chip applications, comprising the steps of providing a chip or wafer having a plurality of metal bonds pads which provide electrical connection to the chip or wafer, and applying a solder bump comprising tin-copper alloy having less than 2% by weight copper, the balance being tin, by an electroplating technique, and melting the solder bumps by heating to a temperature above the bump melting point to effect reflow.

2. A method according to claim 1 wherein the solder is tin-copper alloy having about 0.7% by weight copper.

3. A method according to claim 1 wherein the elements of the tin-copper alloy are simultaneously co-deposited as the alloy from a single plating solution.

4. A method according to claim 1 wherein the tin-copper, alloy is deposited by sequentially plating pure elements, which form the requisite alloy on heating.

5. A method according to claim 1 wherein the chip or wafer is provided with a layer of thick photosensitive material patterned to define the location of the solder bumps, the photosensitive material being of between 25 and 200 $\mu$m thickness.

6. A method according to claim 1 wherein the electroplating is carried out using a direct current.

7. A method according to claim 1 wherein the electroplating is carried out using a pulsed alternating current.

8. A method according to claim 1 wherein each pulse comprises about +5 V for about 1 millisecond, zero voltage for about 1 millisecond, about −5 V for about 1 millisecond, followed by zero voltage for about 1 millisecond.

9. A chip or wafer having solder bumps formed according to the method of claim 1.

10. A method for forming solder bumps on a chip or wafer for flip-chip applications comprising the steps of:
 (a) providing a chip or wafer having a passivation layer and a plurality of exposed metallic bond pads;
 (b) applying at least one solder-wettable metal layer to the bond pad;
 (c) applying a photosensitive layer to the chip or wafer having openings at the portions of the bond pads;
 (d) applying a solder comprising tin-copper alloy having less than 2% by weight copper with the balance being tin by an electroplating technique
 (e) removing the photosensitive layer; and
 (f) melting the solder bumps to effect reflow.

11. A chip or wafer having solder bumps formed according to the method of claim 10.

* * * * *